United States Patent [19]
Bergeron et al.

[11] Patent Number: 5,517,127
[45] Date of Patent: May 14, 1996

[54] ADDITIVE STRUCTURE AND METHOD FOR TESTING SEMICONDUCTOR WIRE BOND DIES

[75] Inventors: Richard J. Bergeron, Essex Junction; Thomas J. LaMothe, Georgia; Joseph E. Suarez, Burlington; John A. Thompson, Monkton Ridge, all of Vt.

[73] Assignee: International Business Machines Corporation, Armonk, N.Y.

[21] Appl. No.: 370,278

[22] Filed: Jan. 9, 1995

[51] Int. Cl.[6] .................... C23C 26/00; H01L 23/48; H01L 29/44
[52] U.S. Cl. .................... 324/760; 324/754; 427/96; 29/840
[58] Field of Search .................... 324/754, 760; 427/96, 374.6, 376.7; 29/840, 843

[56] References Cited

U.S. PATENT DOCUMENTS

| | | | |
|---|---|---|---|
| 4,188,636 | 2/1980 | Sato et al. | 357/71 |
| 4,223,337 | 9/1980 | Kojima et al. | 357/68 |
| 5,061,988 | 10/1991 | Rector | 357/74 |
| 5,123,850 | 6/1992 | Elder et al. | 439/67 |
| 5,279,975 | 1/1994 | Devereaux et al. | 437/8 |
| 5,281,684 | 1/1994 | Moore et al. | 427/96 |
| 5,307,010 | 4/1994 | Chiu | 324/158 |

*Primary Examiner*—Kenneth A. Wieder
*Assistant Examiner*—Barry C. Bowser
*Attorney, Agent, or Firm*—Heslin & Rothenberg

[57] ABSTRACT

A structure and method for achieving burn-in and full functional testing of a semiconductor wire bond die are provided. The structure comprises an electrical conductor which connects a wire bond pad to a solderable test contact laterally displaced from the wire bond pad. The solderable test contact is configured to facilitate electrical connection of an external testing device thereto for electrical testing and/or burn-in of integrated circuitry associated with the die, without direct physical contact to the wire bond pads. The structure does not need to be removed following the burn-in or test.

22 Claims, 2 Drawing Sheets

ADDITIVE STRUCTURE AND METHOD FOR TESTING SEMICONDUCTOR WIRE BOND DIES

TECHNICAL FIELD

The present invention generally relates to a structure and method for testing semiconductor wire bond dies, and more particularly, to a structure and method for burn-in and full functionality testing of semiconductor wire bond dies.

BACKGROUND ART

Full functionality testing is known to be carried out on semiconductor solder bump connect dies while the dies are still embodied in the silicon wafer. However, burn-in followed by the testing of semiconductor wire bond dies is generally not done at the wafer level because of inherent structural difficulties and the nature of making wire connections to external structures. Instead, burn-in and full testing of wire bond dies is generally done only after the dies have been severed from the wafer and packaged.

Typically, semiconductor wire bond dies defined on a semiconductor wafer undergo initial low-level dc testing wherein individual dies are tested for satisfactory operation. However, there are problems associated with this form of testing. External testing probes directly contacting wire bond pads can damage the wire bond pads by scratching or marking the pads such that subsequent wire bond electrical connection thereto can be difficult. In addition, electrical contact to wire bond pads may be inconsistent when probe contacts must be maintained for any considerable length of time.

After dc testing, the wafer is severed between individual dies, inoperable dies are discarded, and operable dies are collected for packaging into a module. After packaging, burn-in and full functionality testing of each die circuit is conducted under extended time and temperature conditions directed to assessing circuit reliability. If a particular wire bond die is found inoperable after packaging, the entire module must often be discarded.

Efforts have been made to eliminate the need for two separate tests and to avoid damaging the surface of the wire bond pad. Such efforts have principally been directed toward constructing a method and structure for conducting wafer level burn-in and full functionality testing of wire bond dies. However, these methods generally require use of additional test structures and levels of interconnection in the kerf region of the wafer. Such structures typically must be removed before dicing the die from the wafer in order to prevent degradation of internal die circuitry performance. Another problem associated with the use of test structures formed in the kerf region is that the number of dies which can be defined on a wafer is limited by the amount of area the test structures require. In addition, the technology required for adding and removing temporary interconnections can contribute significantly to the wafer processing costs.

A need, therefore, continues to exist for an improved structure and method for achieving burn-in and full functionality testing of a semiconductor wire bond die.

DISCLOSURE OF THE INVENTION

Briefly, in one aspect of the present invention, a structure is provided for facilitating electrical testing of a semiconductor wire bond die without direct physical contact of an external testing device to a wire bond pad of the die. The structure, which is disposed at an upper surface of the semiconductor wire bond die, comprises an electrical conductor having a solderable test contact. The solderable test contact, which is laterally displaced from the wire bond pad, is configured to facilitate electrical connection of an external testing or burn-in device thereto for electrical testing or burning in of the semiconductor wire bond die. The electrical conductor is disposed entirely in a region above the active circuitry of the semiconductor wire bond die and does not require removal after testing or burning in of the die.

In a more specific embodiment, the present invention provides a structure for facilitating the testing of or burning in a semiconductor wire bond die having an upper surface insulator with an aperture through which a wire bond pad is exposed. conductive strap physically and electrically contacts the wire bond pad by covering an upper surface thereof. The conductive strap extends laterally from the wire bond pad above the upper surface insulator and connects with a solderable conductive test protrusion which is disposed thereon. The conductive strap and the solderable conductive test protrusion are disposed in a region above the active circuitry of the semiconductor wire bond die. The solderable conductive test protrusion is configured to facilitate connection of an external testing device thereto in order to allow electrical testing of the semiconductor wire bond die without direct physical contact of the external testing device to the wire bond pad. The solderable conductive test protrusion allows connection between the die and a high performance testing or burn-in device without affecting the surface of the wire bond pad.

In another aspect, the present invention provides a method for electrically testing a semiconductor wire bond die defined on a semiconductor wafer. The semiconductor wire bond die has a wire bond pad disposed at an upper surface thereof. The method includes forming an electrical conductor having a solderable test contact above the upper surface of the die and above the active circuitry of the die. The solderable test contact is laterally displaced from the wire bond pad and is configured to facilitate electrical testing of the die through contact with an electrical testing device. The electrical conductor includes an electrical interconnect portion which electrically connects the wire bond pad with the solderable test contact. The method also includes electrically connecting an external test connector to the solderable test contact, then electrically testing the semiconductor wire bond die using the external test connector without directly physically contacting the wire bond pad.

To restate, the present invention satisfies the need for a structure and method for achieving burn-in and testing of individual semiconductor wire bond dies prior to modular packaging. The invention provides a structure for testing that is confined within the boundary of the semiconductor wire bond die, thereby eliminating use of the kerf area surrounding the wire bond die. The structure need not be removed from the die after testing but can remain on the die without impacting circuit performance or reliability. Also, because the kerf area is not used, the physical presence of the test structure is not a limiting factor in determining the number of semiconductor wire bond dies that can be defined on a wafer.

Another advantage of the present invention is that no direct physical contact is made to the wire bond pads by an external testing device. Thus, the wire bond pads remain undamaged from testing, and subsequent wire bond electrical connection thereto is facilitated. Further, the present invention provides a structure and method that obviate the conventional practice of utilizing a separate low-level method of testing the die using a probe, followed by burn-in and full functionality testing after severance and packaging. Currently, use of expensive test probes limits the minimum size of the die because the wire bond pads must be spaced far enough apart to prevent probe damage. Because probe testing on the wire bond pad is eliminated in accordance with the invention, wire bond dies can be fabricated in a smaller size.

The structure and method for testing presented herein are economically beneficial because losses incurred due to discarded defective multichip modules can be eliminated. Finally, a savings to the semiconductor chip manufacturer and ultimately to the consumer can be realized because a greater number of dies can be defined on a wafer due to smaller die size and more efficient use of the kerf area surrounding the dies.

BRIEF DESCRIPTION OF THE DRAWINGS

These, and other objects, features and advantages of this invention will be more readily understood from the following detailed description of the various aspects of the invention taken in conjunction with the accompanying drawings in which.

BEST MODE FOR CARRYING OUT THE INVENTION

As noted, the present invention provides a structure and method for achieving burn-in and testing of a semiconductor wire bond die. In particular, a new contact point for facilitating electrical testing of the die's integrated circuitry is created above the active region of the die to replace use of the wire bond pads for testing. Thus, no direct physical contact of an external testing device is made to the wire bond pads of the die during testing or burn-in, and the problem of damage thereto is eliminated. The test contact points and electrical connections between the contact points and the die circuitry through the wire bond pads remain on the die after testing or burn-in. Thus, if the tested die is defined on a wafer, subsequent dicing may be done without removing the structure and without impacting circuitry performance.

Figure 1:
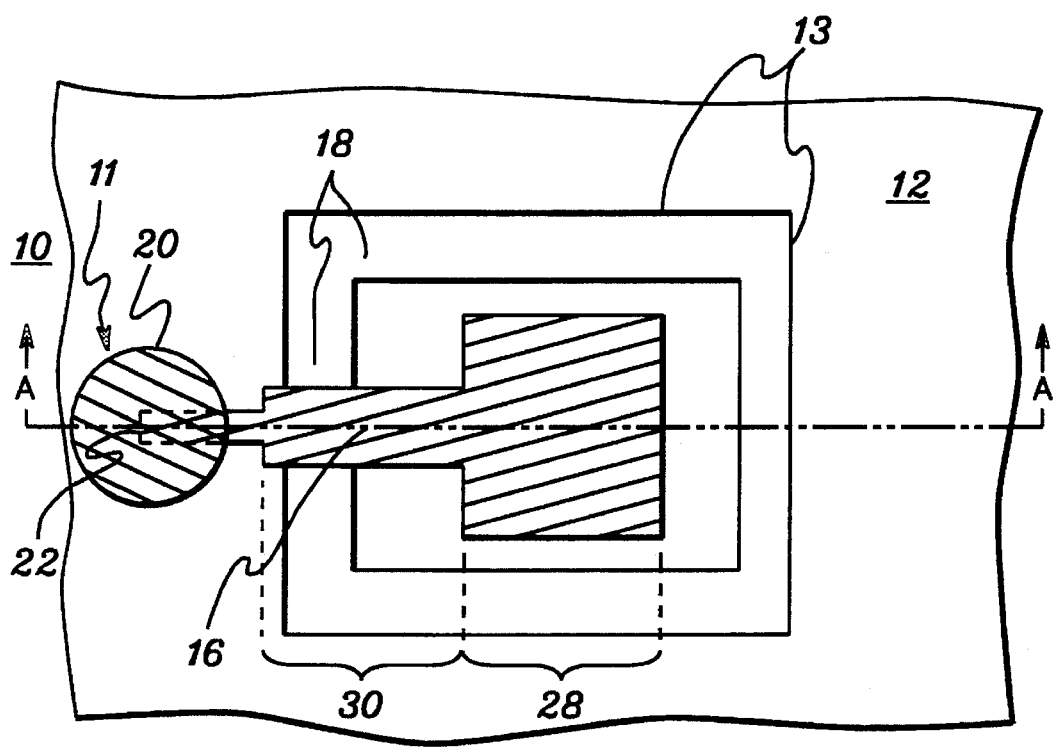
FIG. 1 is a top plan view of a portion of an individual semiconductor wire bond die illustrating the preferred additive test structure of the invention.
Figure 2:
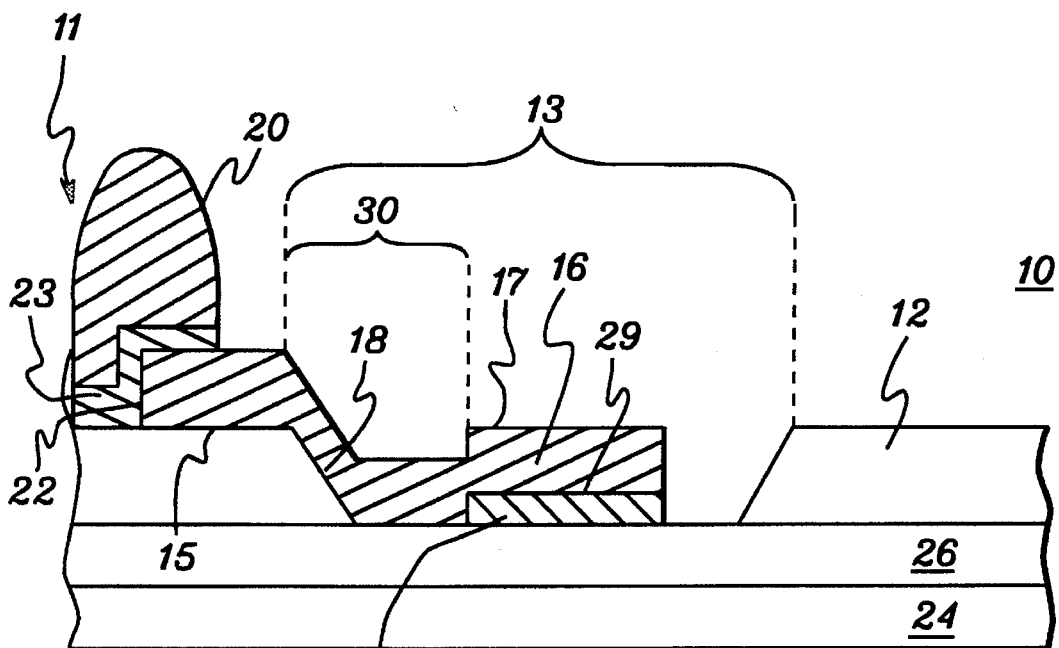
FIG. 2 is a cross section of the structure of FIG. 1 taken along lines A—A.

Referring to the drawings, FIG. 1 is a top plan view of a portion 10 of an individual semiconductor wire bond die illustrating one embodiment of an additive test structure 11 (shaded region) in accordance with the present invention, shown in relation to a single wire bond pad 28 (FIG. 2) of the die 10. Portion 10 is entirely disposed above the active integrated circuitry of the die. Additive test structure 11 includes a conductive strap 16 and a solderable test protrusion 20. As shown in FIG. 2, wire bond pad 28 resides directly beneath conductive strap 16.

"Conductive strap" is used herein to include any electrical conductor and is preferably a conductive metal layer compatible with wire bonding disposed on the semiconductor wire bond die. "Solderable" is used herein to refer to a metal capable of being joined with other metals using a melted metal alloy such as tin and lead. "Solderable test protrusion" is used herein to refer to a solderable conductive test contact on the die, which is preferably a protruding solderable conductive metal configured to facilitate electrical connection to an external connector such as a high performance testing or burn-in device. A bump such as a gold bump or solder ball is preferred, and a controlled collapse chip connect (C4) type solder ball comprising lead and tin may be used.

Final passivation layer 12, which generally covers the entire top surface of the processed semiconductor wafer, serves to protect and insulate individual dies from damage during packaging and probe testing. Layer 12 may comprise a dielectric material such as a polyimide, silicon dioxide, or silicon nitride. Structure 11 is shown disposed on final passivation layer 12, but the structure is not limited to being directly thereon, and the term "final passivation layer" as used herein includes any upper surface insulator of the semiconductor wire bond die.

An aperture 13 in passivation layer 12 traditionally exposes upper surface 29 of wire bond pad 28, and final passivation layer 12 has a sloped upper surface 18 bordering aperature 13. As shown in the FIGS. 1 and 2, passivation layer 12 does not reach wire bond pad 28. However, passivation layer 12 may contact wire bond 28, and other configurations of passivation layer 12 with respect to wire bond pad 28 will be obvious to those skilled in the art.

Conductive strap 16 electrically interconnects wire bond pad 28 and solderable test protrusion 20 such that external testing of the semiconductor wire bond die is possible through solderable test protrusion 20 without direct physical contact of the test device to wire bond pad 28 or to upper surface 17 of conductive strap 16. Also, because conductive strap 16 preferably covers the entire upper surface 29 of wire bond pad 28 and has an upper surface 17 itself, subsequent wire bond electrical connection to wire bond pad 28 can be made through upper surface 17 of conductive strap 16.

Conductive strap 16 extends from wire bond pad 28, up sloped surface 18, and laterally across final passivation layer 12. Conductive strap 16 terminates thereon preferably at an end 22 disposed beneath test protrusion 20 at a point laterally displaced from wire bond pad 28. Test protrusion 20 resides directly on conductive strap 16, and preferably, on a portion of final passivation layer 12 adjacent to conductive strap 16.

Conductive strap 16 has a tapered width from a middle section 30 to end 22 beneath test protrusion 20. This tapering allows increased adherence of test protrusion 20 to final passivation layer 12. Because test protrusion 20 is preferably not removed from the semiconductor wire bond die after testing, good adherence of test protrusion 20 to the semiconductor wire bond die is important to prevent inadvertent detachment of the test protrusion during testing, burning-in, dicing, or packaging.

The width of middle section 30 of conductive strap 16 is shown narrower than that covering wire bond pad 28. However, middle section 30 may have any width and is not limited to a width less than that contacting wire bond pad 28 or greater than that at end 22.

As shown in FIG. 2, additive test structure 11 of the present invention is disposed above a semiconductor wire bond die comprising a semiconductor substrate having a region of active circuitry 24 associated therewith, metallization levels 26 electrically connected to active circuitry region 24, and wire bond pad 28 disposed above metallization levels 26. Wire bond pad 28 is electrically connected to active circuitry region 24 through metallization levels 26. Wire bond pad 28 has an upper surface 29 above the lower metallization levels.

An adhesive conductive film 23 comprising a layer or layers of a conductive metal may be interposed between solderable test protrusion 20 and conductive strap 16 and between solderable test protrusion 20 and exposed surface 15 of final passivation layer 12 in order to increase adherence of solderable test protrusion 20 thereto. Preferably, a first layer of chromium or titanium is used which is known to adhere well to the aforementioned passivation layers. However, solderable metals, such as those used to form solderable test protrusion 20, do not adhere well to chromium or titanium. Thus, in addition, a metallic layer or layers which adhere well to the underlying chromium or titanium first layer and solderable test protrusion 20 are interposed between solderable test protrusion 20 and the first layer to facilitate adherence. Preferably, a layer of copper on the chromium or titanium first layer, followed by a layer of gold on the copper layer is used. However, the present invention is not limited to the use of the aforementioned metals, and additional metals that may be used to form an adhesive conductive film will be obvious to those skilled in the art.

Figures 3A, 3B:
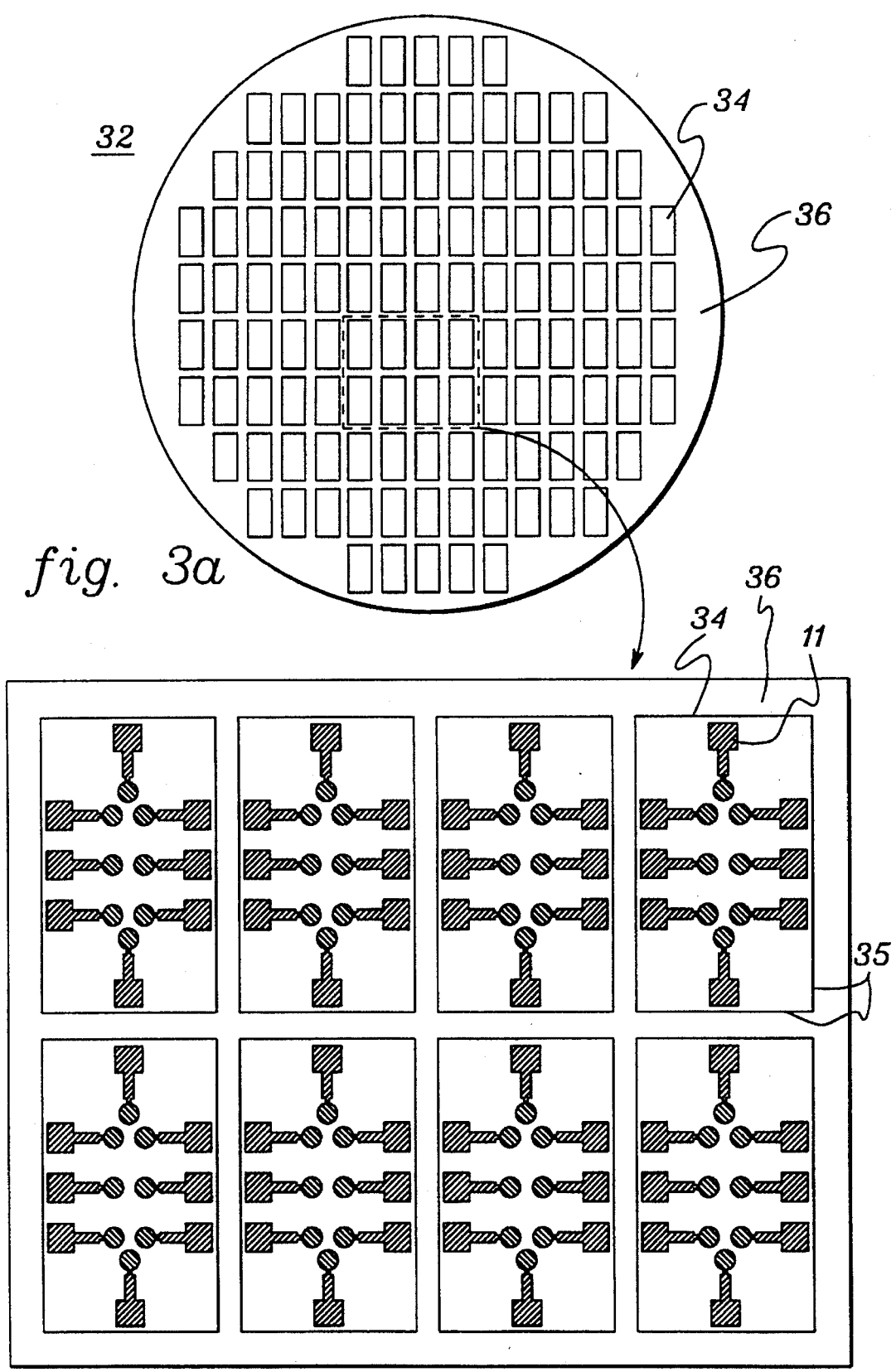
FIG. 3a is a plan view of a semiconductor wafer having a plurality of semiconductor wire bond dies defined therein.
FIG. 3b is an enlarged plan view of a portion of FIG. 3a, illustrating two rows, each row comprising a series of four semiconductor wire bond dies.

FIG. 3a is a top plan view of a semiconductor wafer 32 comprised of a plurality of semiconductor wire bond dies 34. Surrounding each semiconductor wire bond die 34 is a kerf region 36.

FIG. 3b is an enlarged view of FIG. 3a illustrating two rows, each of a series of four semiconductor wire bond dies 34. The underlying region of active circuitry is contained within boundary 35 of each wire bond die 34, with kerf region 36 surrounding each die 34. A plurality of additive test structures 11 reside on each semiconductor wire bond die 34, with each additive test structure being connected to a corresponding wire bond pad. Additive test structures 11 are spaced apart so as to be electrically isolated. Each additive test structure 11 is disposed entirely over the active circuitry of the die such that dicing through kerf 36 may be done without severing any additive test structure 11. Thus, additive test structures 11 may remain on the semiconductor wire bond dies without impacting circuit performance upon dicing. Each individual wire bond die 34 diced from wafer 32 forms a semiconductor wire bond chip that will have a plurality of additive test structures 11 thereon.

The method for testing a semiconductor wire bond die in accordance with the present invention includes forming the above-discussed additive test structure 11. Generally, conductive strap 16 of structure 11 is formed on the die by depositing a metallization layer, e.g., comprising a layer of aluminum or a layer of aluminum over a layer of titanium, onto exposed surface 15 of final passivation layer 12. The metallization layer is then patterned employing available techniques, such as additive lift-off or reactive-ion-etching. The metallization layer is deposited to a thickness sufficient for conductive strap 16 to overlay sloped upper surface 18. For example, where aluminum over titanium is used as the metallization layer, an aluminum layer having a thickness of about 4 μ on a layer of titanium having a thickness of about 1000Å is sufficient.

Solderable conductive test protrusion 20, such as a solder ball or gold bump, is then formed on conductive strap 16, adjacent end 22 and on final passivation layer 12. However, conductive adhesive film 23 may be deposited prior to formation of solderable conductive test protrusion 20 to aid in adhesion of solderable conductive test protrusion 20 to final passivation layer 12.

Testing of die circuitry is performed after electrically connecting an external testing connector (not shown) directly to solderable test protrusion 20. Testing includes, but is not limited to, burning-in of the semiconductor wire bond die followed by full functionality ac testing. After testing, the external test connector is removed from solderable test protrusion 20.

As stated above in relation to FIGS. 3a and 3b, dicing of individual semiconductor wire bond dies 34 from wafer 32 may be done after testing without removing additive test structures 11 from dies 34. This is because the entire additive test structure 11 of the invention resides above the active circuitry of the die and does not extend into wafer kerf area 36. Therefore, dicing through kerf area 36 does not cut through any portion of additive structure 11 exposing die circuitry, and the need for removal of the added elements of structure 11 is eliminated. Subsequent wire bond electrical connection to wire bond pad 28 is facilitated through provision of an upper surface 17 on conductive strap 16.

The method of the invention can also include fabricating the semiconductor wire bond die to be tested. As shown in FIG. 2, active circuitry 24 is defined in a semiconductor substrate along with a plurality of wire bond pads 28 electrically connected thereto through metallization levels 26. A final passivation layer 12 comprising a polyimide, silicon dioxide, or silicon nitride is then formed above the active circuitry 24 and metallization levels 26, and a plurality of apertures 13 is etched through final passivation layer 12 exposing each wire bond pad 28. Additive test structure 11 is then formed on exposed surface 15 of final passivation layer 12 and on upper surface 29 of wire bond pad 28.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

We claim:

1. A structure for facilitating testing or burn-in of a semiconductor wire bond die having a region of active circuitry associated therewith, said semiconductor wire bond die including a wire bond pad disposed at an upper surface thereof, said structure comprising:

an electrical conductor comprised of a conductive metal compatible with wire bonding, said electrical conductor having a solderable test contact disposed above said upper surface of said semiconductor wire bond die, said test contact being configured to facilitate electrical contact of an external connector thereto, said electrical conductor including an electrical interconnect portion extending laterally from said wire bond pad over said region of active circuitry of said semiconductor wire bond die such that said solderable test contact is laterally displaced from said wire bond pad and disposed above said region of active circuitry, said electrical interconnect portion electrically connecting said solderable test contact and said wire bond pad such that electrical testing of said semiconductor wire bond die can occur through said solderable test contact without direct physical contact of said external connector to said wire bond pad, whereby subsequent wire bond electrical connection to said wire bond pad is facilitated.

2. The structure according to claim 1, wherein said electrical interconnect portion is configured to facilitate adherence of said solderable test contact to said upper surface of said semiconductor wire bond die.

3. The structure according to claim 2, wherein a tapered region of said electrical interconnect portion terminates below said solderable test contact.

4. The structure according to claim 1, wherein said electrical conductor substantially covers an upper surface of said wire bond pad and has an upper surface above said wire bond pad to facilitate subsequent wire bond electrical connection to said wire bond pad through said electrical conductor.

5. A structure for facilitating testing and burn-in of a semiconductor wire bond die having a wire bond pad and a region of active circuitry associated therewith, said semiconductor wire bond die also including an upper surface insulator having an aperture therein exposing said wire bond pad, said structure comprising:

a conductive strap comprised of a conductive metal compatible with wire bonding, said conductive strap electrically and physically contacting said wire bond pad to substantially cover an upper surface of said wire bond pad, said conductive strap having an upper surface above said wire bond pad to facilitate subsequent wire bond electrical connection to said wire bond pad through said conductive strap, said conductive strap extending in a lateral direction from said wire bond pad above said upper surface insulator and above said region of active circuitry of said semiconductor wire bond die; and a solderable conductive test protrusion disposed on said conductive strap, said solderable conductive test protrusion being laterally displaced from said wire bond pad and disposed above said region of active circuitry of said semiconductor wire bond die, said solderable conductive test protrusion being configured to facilitate connection of an external test device thereto such that electrical testing of said semiconductor wire bond die can occur through said structure without direct physical contact of said external test device to said wire bond pad.

6. The structure according to claim 5, wherein said solderable conductive test protrusion is also partially disposed on said upper surface insulator in a region adjacent to said conductive strap such that said solderable conductive test protrusion is physically adhered to said upper surface insulator.

7. The structure according to claim 6, further comprising an adhesive conductive film interposed between said solderable conductive test protrusion and said upper surface insulator and between said solderable conductive test protrusion and said conductive strap to facilitate adherence of said solderable conductive test protrusion to said upper surface insulator and to said conductive strap, respectively.

8. The structure according to claim 7, wherein said adhesive conductive film comprises a first layer of chromium or titanium.

9. The structure according to claim 8, wherein said adhesive conductive film further comprises a layer of copper on said first layer and a layer of gold on said copper layer.

10. The structure according to claim 5, wherein said conductive strap is tapered under said solderable conductive test protrusion and wherein said solderable conductive test protrusion partially resides on said upper surface insulator.

11. The structure according to claim 5, wherein said solderable conductive test protrusion comprises a bump formed from a solder ball or a gold bump.

12. The structure according to claim 5, wherein said upper surface insulator comprises a final passivation layer of said semiconductor wire bond die.

13. The structure according to claim 12, wherein said upper surface insulator has an exposed surface and a sloped upper surface bordering said aperture, and wherein said conductive strap resides directly on said wire bond pad, on a portion of said sloped upper surface, and on a portion of said exposed surface.

14. A semiconductor wire bond die comprising:

a semiconductor substrate having a region of active circuitry associated therewith;

a plurality of wire bond pads disposed above said semiconductor substrate and electrically connected to said region of active circuitry;

a plurality of exposed electrical conductors comprised of a conductive metal compatible with wire bonding and disposed above said semiconductor substrate, each exposed electrical conductor being electrically and physically connected to an upper surface of a respective wire bond pad of said plurality of wire bond pads and configured to extend above said region of active circuitry in a lateral direction from said respective wire bond pad, said plurality of exposed electrical conductors being disposed such that each exposed electrical conductor is spaced from all other exposed electrical conductors of said plurality of exposed electrical conductors; and a plurality of solderable test contacts, each test contact being configured to facilitate electrical contact of an external connector thereto, each test contact being electrically connected to a respective exposed electrical conductor of said plurality of exposed electrical conductors and disposed above said region of active circuitry of said semiconductor substrate, each solderable test contact being laterally displaced from said respective wire bond pad such that electrical testing of said semiconductor wire bond die can occur through each solderable test contact without direct physical contact of said external connector to said respective wire bond pad, whereby subsequent wire bond electrical connection to said respective wire bond pad is facilitated.

15. The semiconductor wire bond die according to claim 14, further comprising a final passivation layer disposed above said region of active circuitry, said plurality of exposed electrical conductors being at least partially disposed on said final passivation layer.

16. The semiconductor wire bond die according to claim 14, wherein each solderable test contact comprises a bump formed from a solder ball or a gold bump.

17. The semiconductor wire bond die according to claim 14, wherein each electrical conductor substantially covers an upper surface of said respective wire bond pad and has an upper surface above said respective wire bond pad to facilitate subsequent wire bond electrical connection to said respective wire bond pad therethrough.

18. A method for testing a semiconductor wire bond die, said semiconductor wire bond die having a region of active circuitry associated therewith, said semiconductor wire bond die also including a wire bond pad disposed at an upper surface thereof, said method comprising:

(a) forming an electrical conductor comprised of a conductive metal compatible with wire bonding, said electrical conductor having a solderable test contact disposed above said upper surface of said semiconductor wire bond die and above said region of active circuitry, said solderable test contact being laterally displaced from said wire bond pad and configured to facilitate electrical contact of an external connector thereto, said electrical conductor including an electrical interconnect portion extending laterally from said wire bond pad over said region of active circuitry and above the upper surface of said semiconductor wire bond die, said electrical interconnect portion electrically connecting said solderable test contact and said wire bond pad;

(b) electrically connecting an external test connector to said solderable test contact; and (c) electrically testing said semiconductor wire bond die using said external test connector without direct physical contact of said external test connector to said wire bond pad., whereby subsequent wire bond electrical connection to said respective wire bond pad is facilitated.

19. The method according to claim 18, wherein said testing step (c) comprises ac testing said semiconductor wire bond die.

20. The method according to claim 19, further comprising the step of burning-in said semiconductor wire bond die.

21. The method according to claim 18, in combination with a method of fabricating said semiconductor wire bond die to be tested, said fabricating method comprising the steps of:

providing a semiconductor substrate and fabricating a region of active circuitry in association therewith and a plurality of wire bond pads disposed there above on an exposed surface, said plurality of wire bond pads being electrically connected to said region of active circuitry; and forming a passivating layer above said exposed surface, said passivating layer having a plurality of apertures therein, each aperture exposing a wire bond pad, said passivating layer having an upper surface comprising said upper surface of said semiconductor die on which said electrical conductor of said step (a) is formed.

22. The method according to claim 21, further in combination with a method of defining a semiconductor wire bond chip, said method comprising the additional step of removing said external test connector from said solderable test contact.

* * * * *